United States Patent
Abadi et al.

(10) Patent No.: US 12,199,619 B1
(45) Date of Patent: Jan. 14, 2025

(54) CASCADED PHASE INTERPOLATOR TOPOLOGY FOR QUADRATURE-RATE MULTILEVEL PULSE AMPLITUDE MODULATION DATA SAMPLING

(71) Applicant: NVIDIA Corporation, Santa Clara, CA (US)

(72) Inventors: Ofek Abadi, Nahariya (IL); Omer Wolkovitz, Kfar Saba (IL)

(73) Assignee: NVIDIA Corporation, Santa Clara, CA (US)

(*) Notice: Subject to any disclaimer, the term of this patent is extended or adjusted under 35 U.S.C. 154(b) by 16 days.

(21) Appl. No.: 18/214,704

(22) Filed: Jun. 27, 2023

(51) Int. Cl.
*H03L 7/08* (2006.01)
*H03L 7/081* (2006.01)
*H03L 7/099* (2006.01)

(52) U.S. Cl.
CPC .......... *H03L 7/0807* (2013.01); *H03L 7/0814* (2013.01); *H03L 7/0998* (2013.01)

(58) Field of Classification Search
CPC .... H03L 7/0807; H03L 7/0814; H03L 7/0998
USPC .......................................................... 375/376
See application file for complete search history.

(56) References Cited

U.S. PATENT DOCUMENTS 11,569,804 B1* 1/2023 Lee .................... H03K 5/01
2022/0294545 A1* 9/2022 Cornelius ............ H04L 5/0044

\* cited by examiner

*Primary Examiner* — Fitwi Y Hailegiorgis
(74) *Attorney, Agent, or Firm* — Lowenstein Sandler LLP (57) ABSTRACT

A receiver includes a multi-phase clock generator to generate phases of a clock signal and a global phase interpolator (PI) circuit coupled to the multi-phase clock generator and to clock and data recovery (CDR) circuitry. The global PI circuit generates initial-adjusted phases from the phases of the clock signal based on a control signal received from the CDR circuitry. A first local PI receives the initial-adjusted phases of the clock signal and applies a first fixed phase shift to the initial-adjusted phases to generate first final-adjusted phases of the clock signal that are useable to sample a first level of multiple levels of a pulse-amplitude-modulated (PAM) data stream.

21 Claims, 10 Drawing Sheets

CASCADED PHASE INTERPOLATOR TOPOLOGY FOR QUADRATURE-RATE MULTILEVEL PULSE AMPLITUDE MODULATION DATA SAMPLING

TECHNICAL FIELD

At least one embodiment generally pertains to computer systems, and more specifically, but not exclusively, to cascaded phase interpolator topology for quadrature-rate multilevel pulse amplitude modulation data sampling.

BACKGROUND

High-speed, multilevel pulse amplitude modulation (PAM) receivers often use quadrature-rate clocking schemes, since such clocking schemes relax the sampling and power dissipation while working with high data rates. In such multilevel PAM receivers, each amplitude level is typically sampled by a different sampler. Since each sampled level suffers from slightly different impairments, the sampling instance of each level might be different.

Thus, in such multilevel PAM receivers, each level has a different optimized sampling phase. In quadrature-rate sampling systems, the adjustment of the optimized sampling phase for each sampling level is complex and expensive in terms of power and area. Further, the multilevel PAM receiver can be implemented at different logical levels, e.g., PAM4, PAM8, according to the modulation index. A typical receiver design uses power-hungry phase-interpolator (PI)-based samplers, each PI to sample over the entire 360 degrees of phase, which makes the typical receiver design inefficient in terms of power, area, and cost.

BRIEF DESCRIPTION OF DRAWINGS

Various embodiments in accordance with the present disclosure will be described with reference to the drawings, in which.

DETAILED DESCRIPTION

Aspects and embodiments of the present disclosure address the above power, area, and cost concerns with employing multiple typical full-scale (or global) PIs that sample over the entire 360 degrees of phase for each data level. For example, in various embodiments, the disclosed PAM receiver or system is adapted with a cascaded PI topology in which fewer of the power-hungry global PIs are employed, and instead, smaller, more efficient local PIs are employed that are configured for sampling over a predetermined phase range. For example, sampling phases across sampling levels of PAM data usually do not vary significantly. As a result, the differences in the sampling phases of each one of the sampling levels of the PAM data is small. Thus, the local PIs may be configured to add a phase shift (e.g., a relatively small negative or positive phase shift) to the output phase of the global PIs in order to make fine adjustments to the final-adjusted phase of the clock signal. These final-adjusted phases of a clock signal can then be employed for sampling respective levels of a PAM data stream.

According to some embodiments, the fewer global PIs are shared for generating initial-adjusted phases of the clock signal, which are then supplied to the local PIs in a cascaded fashion. Each local PI may then add a fixed phase shift to the initial-adjusted phases to generate final-adjusted phases of the clock signal. In some embodiments, this fixed phase shift is configurable to be between zero and 90 degrees, e.g., significantly less than a full 360 degrees of phase. In these embodiments, each final-adjusted phase of the clock signal is then used to sample a particular data level of the multiple levels of the PAM data stream.

In some embodiments, a set of local PIs is employed for each data level of the multiple PIs in order to act on more than one initial-adjusted phase of the clock signal. In some embodiments, the different data levels include data edges, one or more up levels, one or more down levels, and one or more middle levels, e.g., depending on whether PAM4, PAM8, or some higher density PAM data stream is being demodulated. In various embodiments, a first local PI is coupled to the global PIs and is configured to receive the initial-adjusted phases of the clock signal. The first local PI can then apply a first fixed phase shift to the initial-adjusted phases to generate first final-adjusted phases of the clock signal that are useable to sample a first level of multiple levels of a PAM data stream. This approach can be replicated with additional local PIs in order to generate all of the final-adjusted phases of the clock signal that are needed for however many PAM levels are present in the PAM data stream to be demodulated.

Therefore, advantages of the receivers, systems, and methods implemented in accordance with some embodiments of the present disclosure include, but are not limited to, a significant savings in power and area by using the smaller local PIs in lieu of a full-scale (or global) PI for each data sampler in the PAM receiver. As will be discussed in more detail, the complexity of the PAM receiver is also reduced in using fewer global PIs to be controlled by clock and data recovery (CDR) circuitry. Other advantages will be apparent to those skilled in the art of PAM data sampling in receivers such as high-speed serial/deserializer (SerDes) receivers, as discussed hereinafter.

Figure 1:
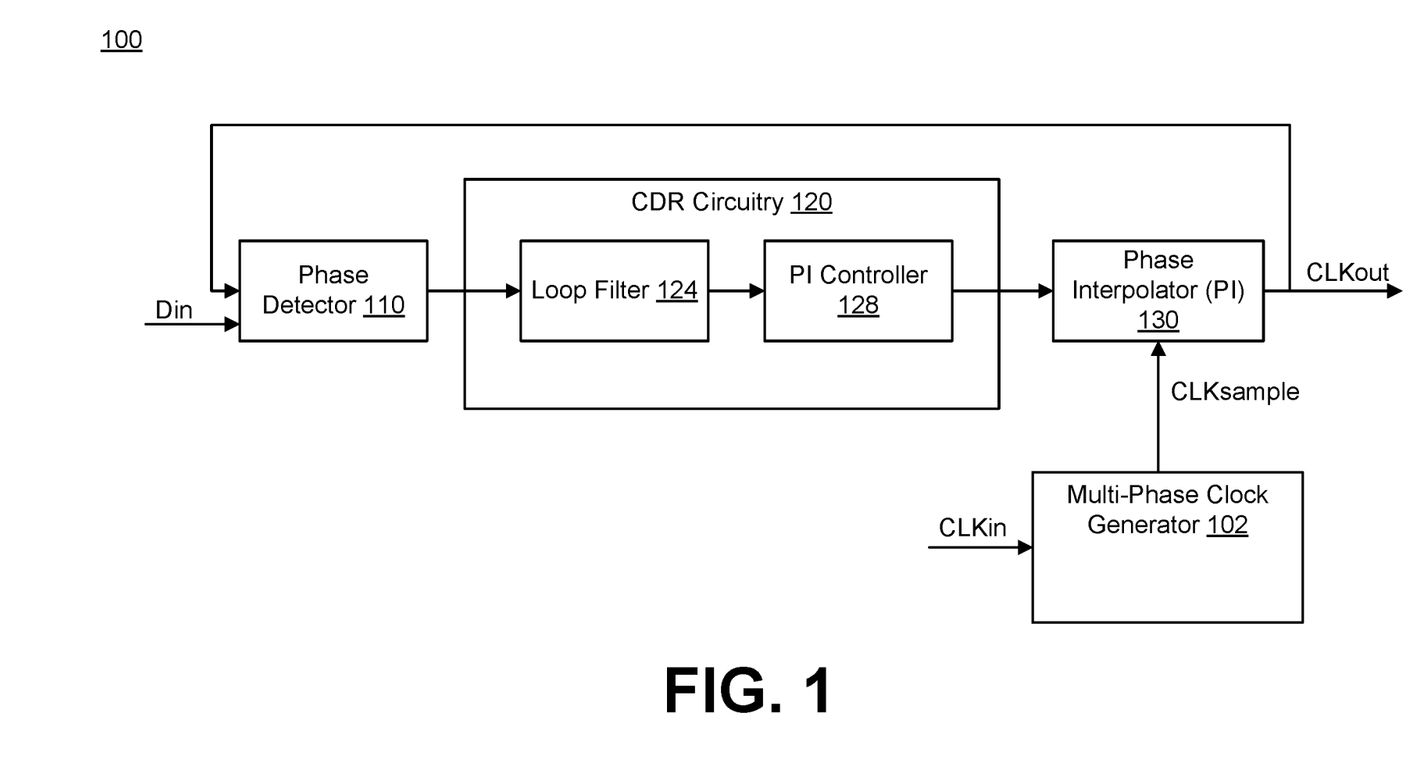
FIG. 1 is a schematic block diagram of an example clock and data recovery (CDR) system according to various embodiments.

FIG. 1 is a schematic block diagram of an example clock and data recovery (CDR) system 100 according to various embodiments. There are many types of CDR systems, which may affect the system sampling scheme. The disclosed embodiments, however, are not limited to any particular sampling scheme. The CDR system 100 may enable recovering both the clock and data that is modulated with the clock from a PAM transmitter. The functioning of the CDR system 100 carries more importance when data is being transferred across different clock domains or other long distances, where the clock signal may become degraded. When data is received at a (e.g., SerDes) receiver, the data may arrive at any phase relative to the receiver clock. In at least some cases, this data is also embedded in the incoming data stream without an accompanying clock signal.

In various embodiments, the CDR system 100 includes a multi-phase clock generator 102, a phase detector 110 (or PD), a phase interpolator (PI) 130 employed for sampling the PAM data, and CDR circuitry 120 coupled between the phase detector 110 and the PI 130. In these embodiments, the CDR circuitry 120 (also referred to herein as CDR logic) includes a loop filter 124 and a PI controller 128, the latter of which controls the PI 130. In some embodiments, the multi-phase-clock generator 102 is implemented using one of a delay-locked loop (DLL) or a phase-locked loop (PLL).

In various embodiments, the phase detector 110, which receives data (Din) and an output clock (CLKout), detects if the clock phase is late or early in relation to the data signal edges. The Din data is PAM-based data in at least some embodiments. The outputs of a signal of the phase detector 110 are proportional to the phase difference between the data signal transitions to sampling clock transitions.

In some embodiments, the CDR circuitry 120 extracts or recovers the clock signal that is implicitly embedded within the data. The CDR circuitry 120 may perform this recovery by looking at the transitions in the data stream. In simpler terms, the CDR circuitry 120 tries to predict the rhythm of the incoming data stream, which can be recovered as the clock used to modulate the data when transmitted. Next, the recovered clock is brought into alignment with the data transitions. This process is known as phase alignment and is necessary to accurately sample the incoming data at the right time. Once the clock has been recovered and aligned with the phase of the data, the clock can then be used to sample and recover the data from the stream. This recovery may involve using the clock to decide when to read the values of the data stream.

More specifically, in some embodiments, the loop filter 124 is also referred to as an integrator, being configured to accumulate a PD signal (from the phase detector 110) and calculate the average phase difference between the data and the clock transitions. In these embodiments, the PI controller 128 (e.g., a DLL or PLL) adjusts the clock phase according to the signal from the loop filter 124, e.g., in performing phase alignment. In some embodiments, the multi-phase clock generator 102 gets a reference clock (CLKin) and generates a sampling clock (CLKsample) based on the reference clock. In embodiments, this sampling clock has an adequate frequency to correctly sample the data, received from a PAM transmitter, and with the right number of phases, e.g., such that the PI 130 will be able to rotate the phase throughout the needed scanning range of phases according to the signal from the PI controller 128. As mentioned, the disclosed embodiments are not limited to any particular sampling scheme.

More specifically, such a multi-phase clock generator 102 may be employed due to quadrature rate sampling, also known as quarter-rate clocking, used in high-speed SerDes devices to effectively sample incoming data at a much lower clock frequency than the data rate. For example, consider a SerDes device running at a data rate of 10 Gbps (gigabits per second). If the receiver were to sample this data directly, the receiver would need a clock running at 10 GHz (gigahertz), which could be challenging to implement due to power, noise, and technology constraints.

Thus, quadrature rate sampling is one approach to solving this problem. In quadrature rate sampling, the clock is run at a quarter of the data rate (hence the name), and four phases of this clock are used to sample the data. In this example, the receiver could be configured to run a clock at 2.5 GHZ, but generate four clock signals, each shifted by 90 degrees with respect to the previous one (hence the term "quadrature"). By doing this, the SerDes receiver effectively samples the PAM data four times in each data bit period, recovering the data while using a lower-speed clock.

One of the advantages of quadrature rate sampling is that it can allow for more straightforward designs, less power consumption, and better noise immunity because of the lower clock speed. Quadrature rate sampling can also help in dealing with issues such as jitter and inter-symbol interference (ISI) because of the multiple samples per bit. However, quadrature rate sampling also adds complexity to the design because of the multi-phase clock and the need for sophisticated data recovery logic, including the power-hungry global PIs each with 360 degrees of phase scanning capability (see FIG. 3A).

Figure 2:
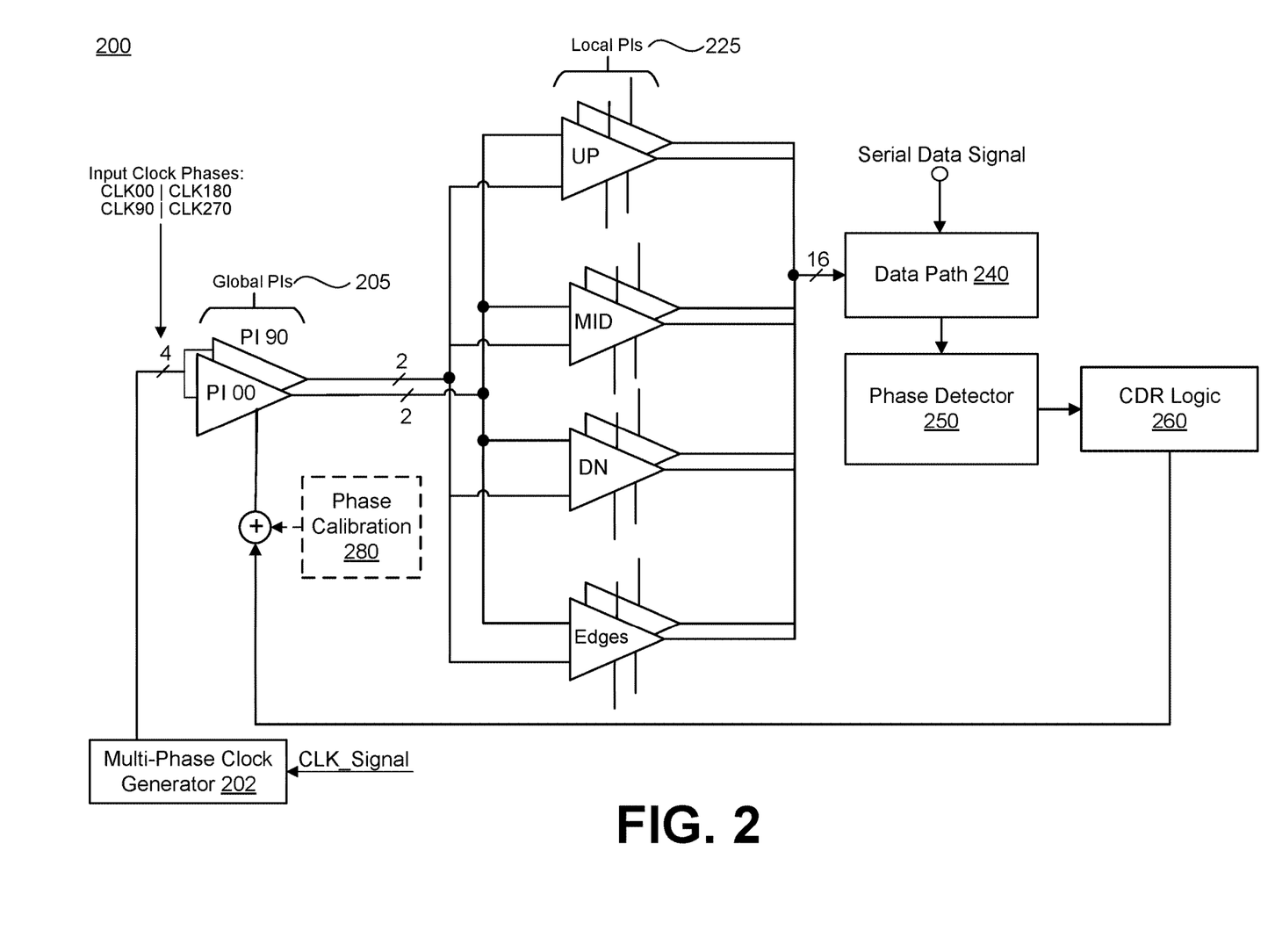
FIG. 2 is a schematic block diagram of an example cascaded phase interpolator (PI) topology (e.g., within a multilevel PAM receiver) for quadrature-rate multilevel PAM data sampling according to at least some embodiments.
Figure 6A:
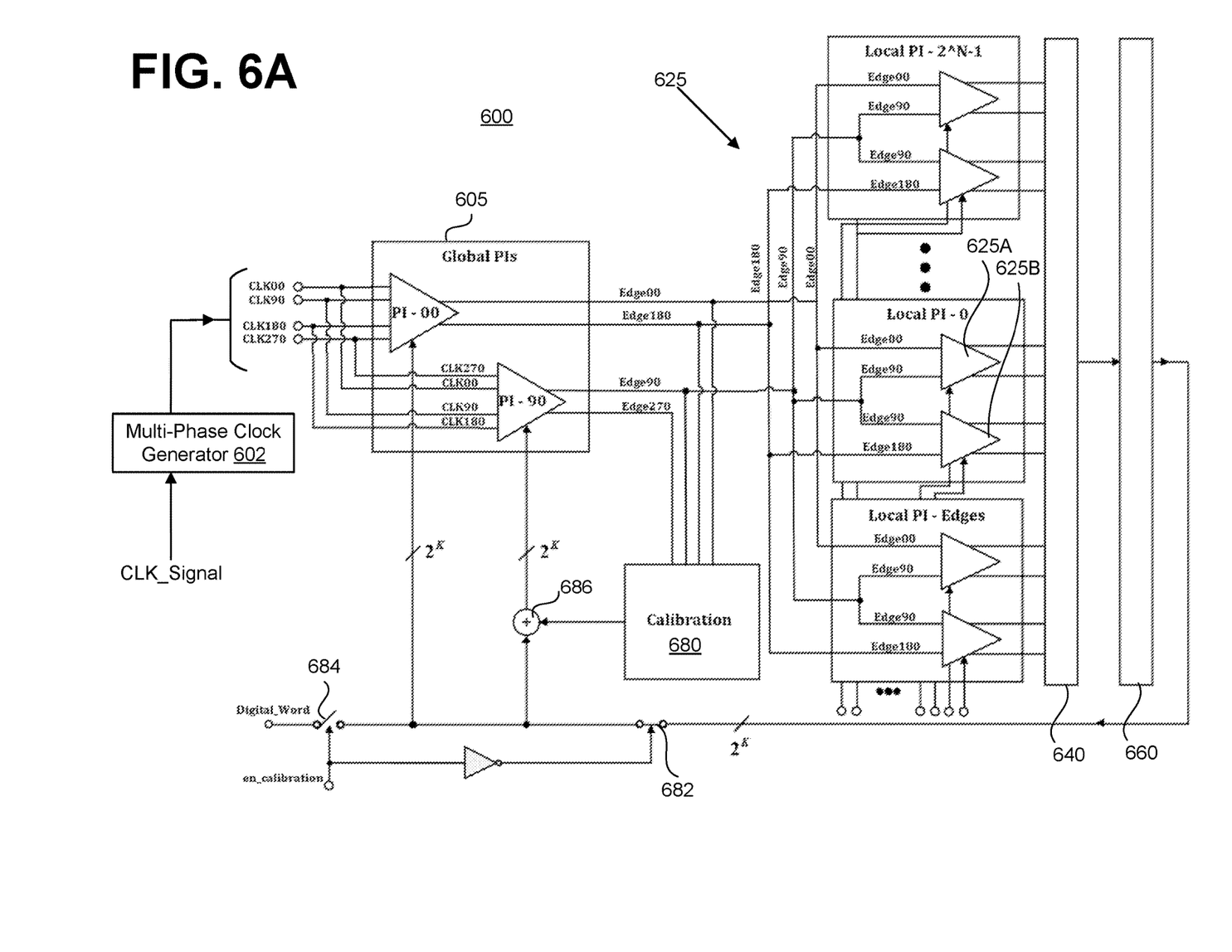
FIG. 6A is a schematic block diagram of a general design for any number of levels of a cascaded PI topology for quadrature-rate multilevel PAM data sampling according to at least some embodiments.

FIG. 2 is a schematic block diagram of an example cascaded phase interpolator (PI) topology 200 (e.g., within a multilevel PAM receiver) for quadrature-rate multilevel PAM data sampling according to at least some embodiments. In various embodiments, the cascaded PI topology 200, which may be integrated within the CDR system 100 (FIG. 1), includes a multi-phase clock generator 202, one or more global PIs 205, a plurality of local PIs 225, data path circuitry 240, a phase detector 250, CDR logic 260, and phase calibration circuitry 280. While a more general topology is discussed with reference to FIG. 6, the PI topology 200 can be more specifically implemented for sampling PAM4 data, which includes PAM levels of up (UP), middle (MID), down (DN), and edges.

In some embodiments, the multi-phase clock generator 202 is the same or similar to the multi-phase clock generator 102 and is configured to generate phases of a clock signal. In at least some embodiments, these phases include 00, 90, 180, and 270 degrees, which may be illustrated as CLK00, CLK90, CLK180, and CLK270, respectively, for purposes of explanation. In some embodiments, these phases are differential, including phases 0 and 180 paired together and phases 90 and 270 paired together. In some embodiments, the phase detector 250 is the same or similar to the phase detector 110 (FIG. 1), which is not further discussed here. In some embodiments, the CDR logic 260 is the same or similar to the CDR circuitry 120 (FIG. 1), which is not further discussed here.

In some embodiments, the global PIs 205 are two in number, each generating a differential pair of outputs, which were just discussed. Each global PI 205 may be coupled between the multi-phase clock generator 202, the CDR logic 260, and the plurality of local PIs 225. Each global PI 205 may be configured to generate initial-adjusted phases from the phases of the clock signal (CLK_signal) based on a control signal received from the CDR logic 260. In some embodiments, a first global PI (e.g., PI 00) generates a first differential pair (e.g., CLK00, CLK180) of the initial-adjusted phases of the clock signal. In these embodiments, a second global PI (e.g., PI 90) generates a second differential pair (e.g., CLK90, CLK270) of the initial-adjusted phases of the clock signal. In these embodiments, each of the first global PI and the second global PI is configured with 360 degrees of phase shift capability.

In at least some embodiments, each local PI of the plurality of PIs 225 receives the initial-adjusted phases of the clock signal and applies a fixed phase shift to the initial-adjusted phases to generate final-adjusted phases of the clock signal that are specific to a corresponding PAM level (e.g., UP, MID, DN, edges). In some embodiments, each fixed phase shift is configurable to be between zero and 90 degrees, e.g., as part of the design of the PI topology 200. In these embodiments, each local PI 225 may cover 90 degrees of phase interpolation. In some embodiments, the phase shift can be understood as adding a delay, e.g., 1 picosecond (ps), 2 ps, 3 ps, or the like, phase delay. In other embodiments, the fixed phase shift is no more than a largest possible difference between phase levels expected in the PAM data stream, and thus, may range between zero to 45 degrees, between zero to 30 degrees, or the like.

According to various embodiments, together with the ability to rotate phases, the CDR logic 260 is configured to lock onto the right phase of the sampling clock (e.g., CLKsample in FIG. 1) so that the phase control is performed in a feedback loop. Any offsets may be added by way of the global phase adjustments by the global PIs 205, which then drive the local PIs 225 to make more granular phase adjustments, in this example, based on being at up, middle, down, or edge level.

As illustrated, each of the local PIs 225 includes a pair of PIs that generate four fine-tuned, final-adjusted phases based on the fixed phase shift. In this way, the plurality of local PIs 225 may generate a total of 16 different final-adjusted phases for use by sampling circuitry within the data path circuitry 240. In some embodiments, each of the first global PI and the second global PI employs a fixed set of bits to phase-adjust the phases of the clock signal. Further, in these embodiments, each local PI employs the fixed set of bits to apply the first fixed phase shift to the initial-adjusted phases of the clock signal, e.g., enabling a higher level of accurate encoding of the final-adjusted phases within a narrower phase range.

Figure 3A:
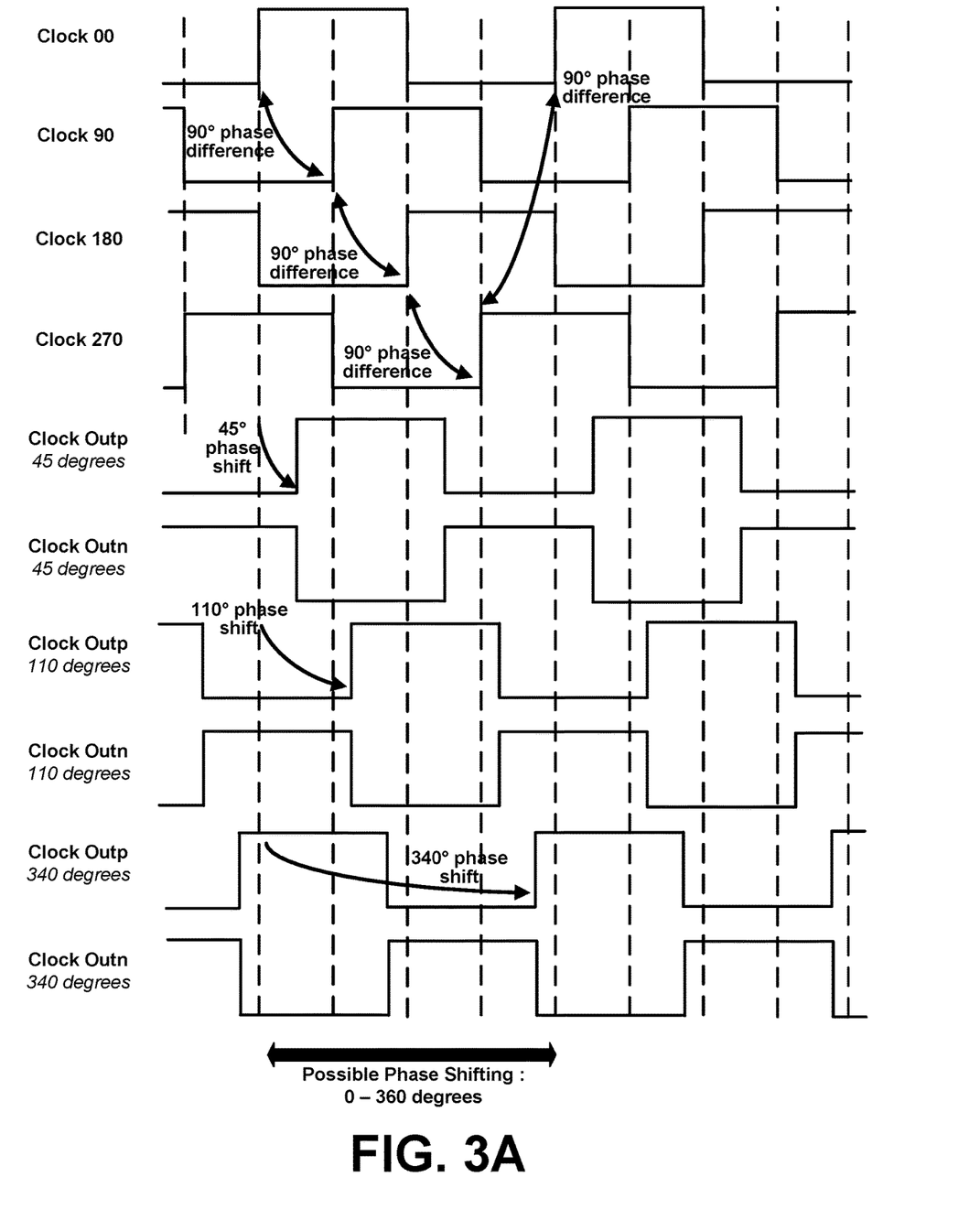
FIG. 3A is a graph illustrating global PI input and output clock waveforms for different digital codes according to various embodiments.

FIG. 3A is a graph illustrating global PI input and output clock waveforms for different digital codes, e.g., 45 degrees, 110 degrees, and 340 degrees, according to various embodiments. In exemplary embodiments, there are 4 input clocks with 90 degrees of phase shift between them, e.g., the previously discussed CLK00 (Clock 00), CLK90 (Clock 90), CLK180 (Clock 180), and CLK 270 (Clock 270), where CLK00 and CLK 180 are differential clock signals, and CLK90 and CLK270 are differential clock signals. In exemplary embodiments, the output clock signals of the cascaded PI topology 200 are differential and have a phase shift (relative to CLK00), which is determined by the digital input. It can be seen that the output phase shift can be between 0 to 360 degrees, meaning that by using the local PIs 225, the cascaded PI topology 200 can scan the entire range of possible phases.

Figure 3B:
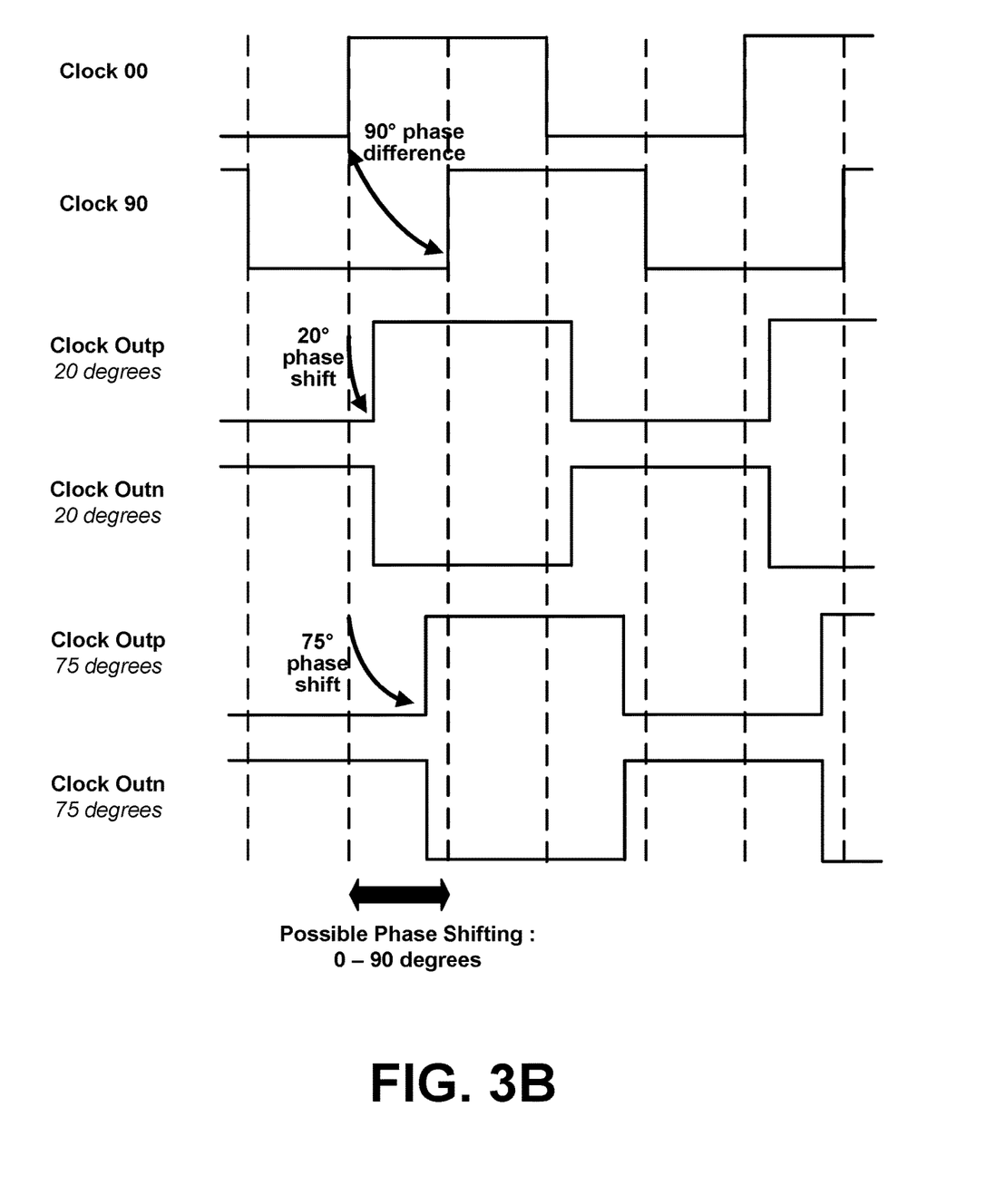
FIG. 3B is a graph illustrating local PI input and output clock waveforms for different digital codes according to various embodiments.

FIG. 3B is a graph illustrating local PI input and output clock waveforms for different digital codes, e.g., 20 degrees and 75 degrees, according to various embodiments. In exemplary embodiments, there are two input clocks with 90 degrees of phase shift between them (CLK00 & CLK90). In exemplary embodiments, the output clock signals are differential and have a phase shift (relative to Clock 00) which is determined by the digital input. It can be seen that the output clocks phase shift can be between 0 to 90 degrees, meaning that by using the local PIs 225, the cascaded PI topology 200 can scan only a quarter of the entire 360 degrees of the possible full range of phases. Since the scanning range is smaller by a factor of four, the resolution is four times higher for the same number of bits, compared to the global PIs 205.

Figure 4:
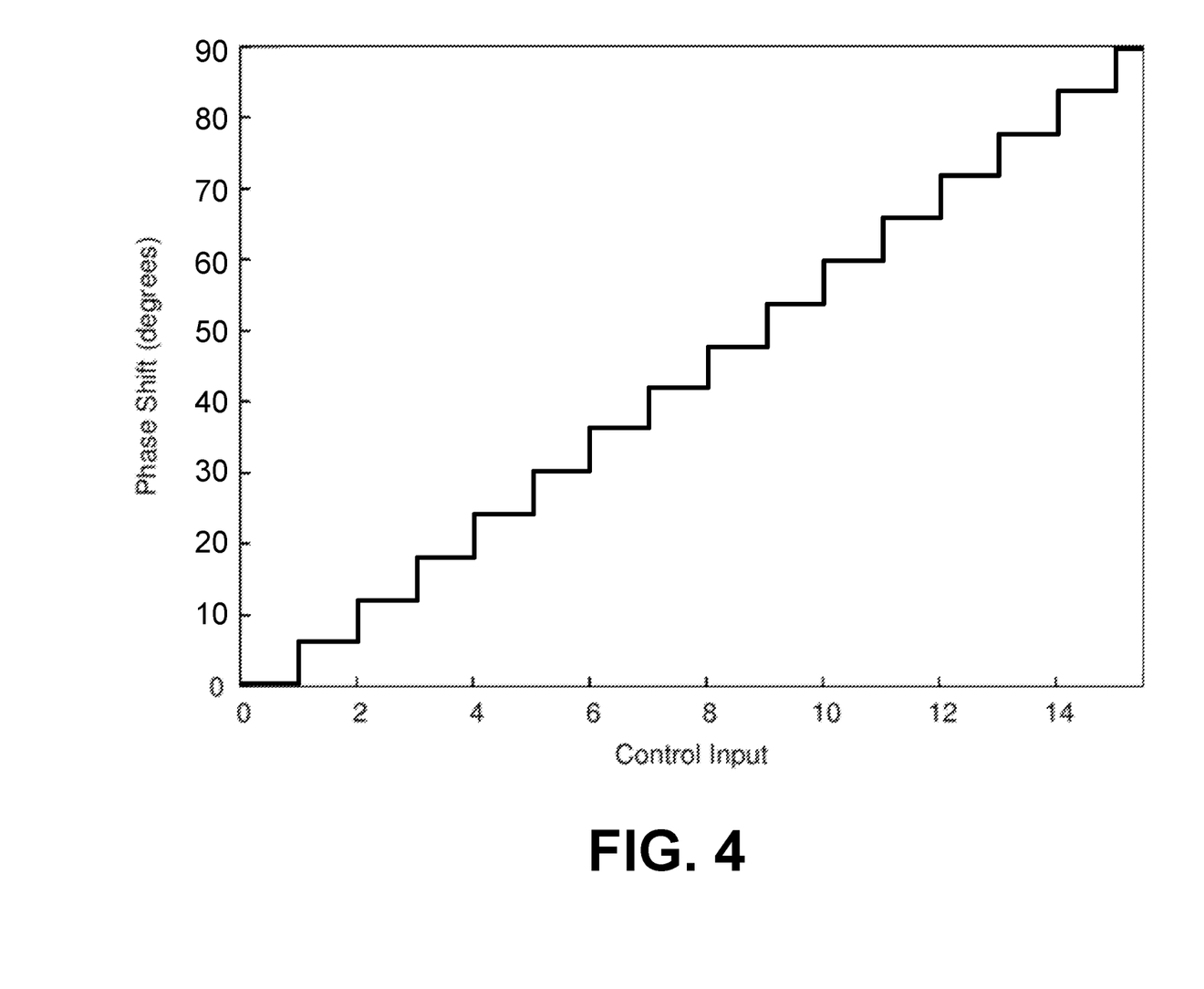
FIG. 4 is a plot graph of phase shift in a local PI versus a digital control input according to an exemplary embodiment.

FIG. 4 is a plot graph of phase shift in a local PI versus a digital control input and for a 4-bit-capable local PI according to an exemplary embodiment. It can be seen that the range of possible phase shifts is between 0 to 90 degrees. Also, the PI resolution in this example is six degrees, as derived below.

$$\text{Phase} - \text{Resolution}_{Local\ PI, 4\ bits} = \frac{90}{2^N - 1} = \frac{90}{2^4 - 1} = \frac{90}{15} = 6°$$

Figure 5A:
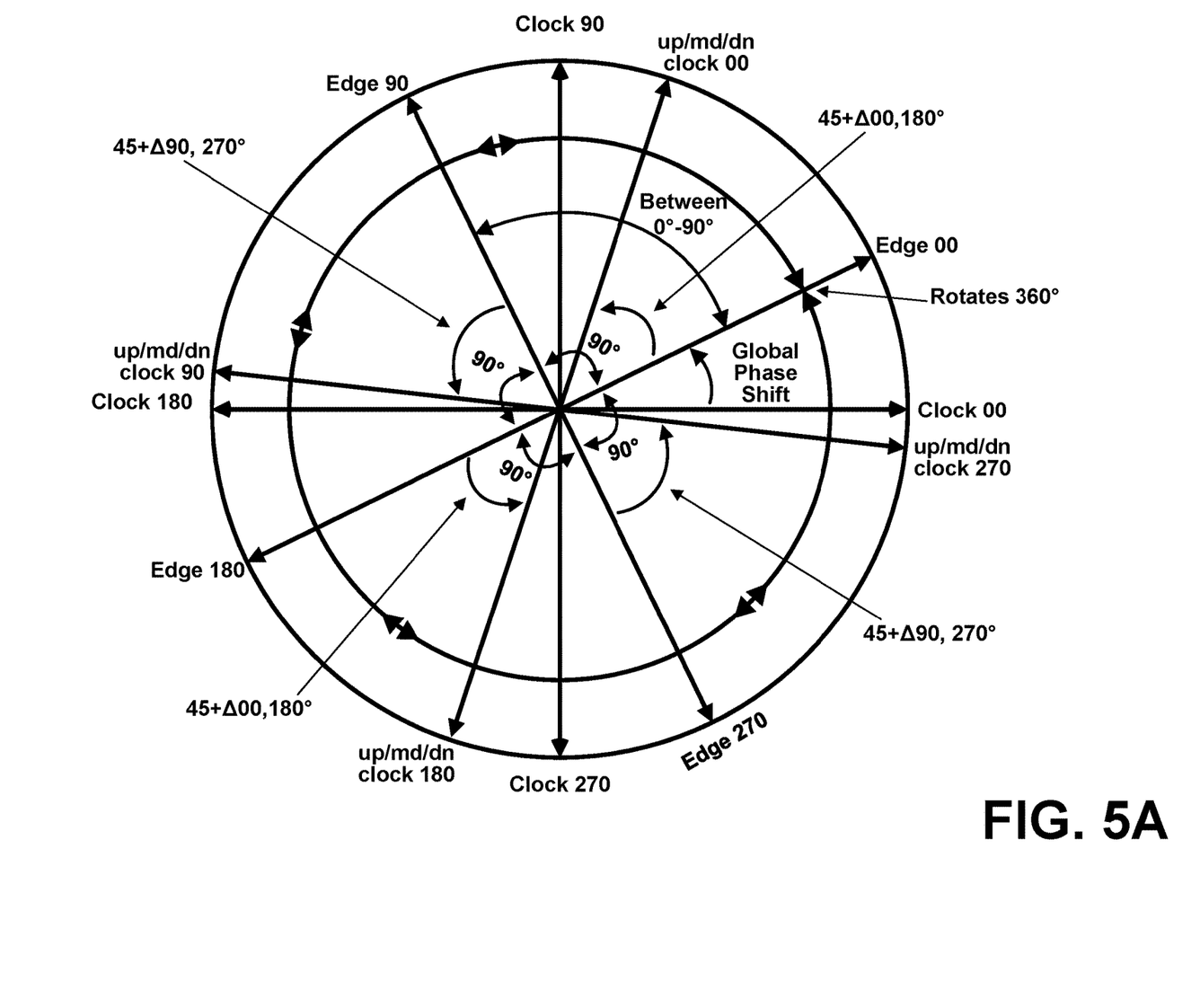
FIG. 5A is a phase diagram for facilitating a comparison of global PI sampling with local PI sampling within the disclosed cascaded PI topology according to various embodiments.

FIG. 5A is a phase diagram for facilitating a comparison of global PI sampling with local PI sampling within the disclosed cascaded PI topology according to various embodiments. As can be observed, according to some embodiments, as illustrated on a unity circle of 360 degrees of phase, the CLK00 is oriented right, the CLK90 is oriented up, the CLK 180 is oriented left, and the CLK270 is oriented down. Further, the Edge 00, Edge 90, Edge 180, and Edge 270 illustrate the edge locations of potential global phase shift adjustments, according to some embodiments. Between these edge locations are illustrated, by way of example, potential locations (which are adjustable) for up/md/dn (up, middle, down) phase shifts associated with the two sets of differential clocks that the plurality of local PIs 225 can generate.

Figure 5B:
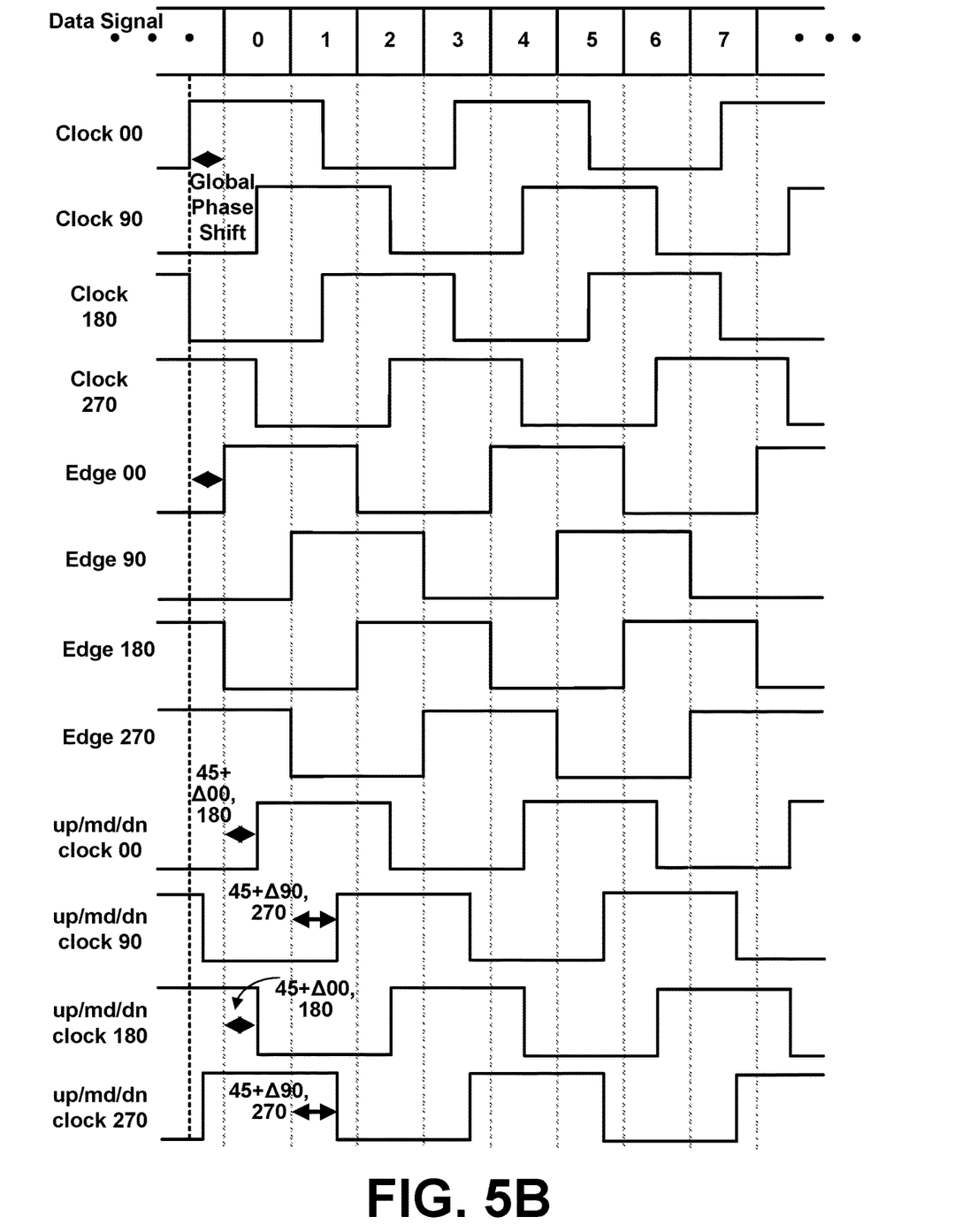
FIG. 5B is a graph illustrating relative clock timing of global PIs versus the local PIs and corresponding available phase shifts in the local PIs according to some embodiments.

FIG. 5B is a graph illustrating relative clock timing of global PIs versus the local PIs and corresponding available phase shifts in the local PIs according to some embodiments. At the top, the serial data path bits are illustrated coming in from left to right, e.g., starting with bit 0, followed by bit 1, then bit 2, and so forth. The next four waveforms illustrate the four phases of the input clock signal, e.g., CLK00 (Clock 00), CLK90 (Clock 90), CLK180 (Clock 180), and CLK270 (Clock 270). The middle fourth waveforms are the global PI output clock phases, as introduced in FIG. 5A, including Edge 00, Edge 90, Edge 180, Edge 270). The last four illustrate the local clock phase output by one of the local PIs 225 (e.g., a pair of PIs of the plurality of local PIs 225), with exemplary phase shift range possibilities for purposes of explanation, not limitation.

In various embodiments, the phases of the global-adjustment clock phases (Edge 00, Edge 90, Edge 180, and Edge 270) are rotating compared to the input clocks (CLK00, CLK90, CLK180, and CLK270) according to the CDR commands tracking the data signal transitions from the CDR logic 260. In these embodiments, the global PI 205 can rotate between 0-360 degrees, while the phase difference between each one of them (Edge 00, Edge 90, Edge 180, and Edge 270) stays at 90 degrees. In some embodiments, the phases of each one of the local-adjustment clocks (up/md/dn clock00, up/md/dn clock90, up/md/dn clock180, and up/md/dn clock270) have a constant and configurable phase-shift compared the global-adjustment clock phases, while the CLK00 and CLK90 can have a different phase-shift, e.g., $45+\Delta_{00,180}$, $45+\Delta_{90,270}$, $\Delta_{00,180}$, and $\Delta_{90,270}$ (illustrated in FIG. 5B) that can be either positive or negative.

FIG. 6A is a schematic block diagram of a general design for any number of levels of a cascaded PI topology 600 for quadrature-rate multilevel PAM data sampling according to at least some embodiments. In various embodiments, the cascaded PI topology 600, which may be integrated within the CDR system 100 (FIG. 1), may be understood as a general cascaded PI topology capable of supporting receiving any PAM data stream, e.g., PAM4, PAM8, PAM16, and so forth. In at least some embodiments, a receiver, device, or system that includes the cascaded PI topology 600 includes a multi-phase clock generator 602, a global PI circuit 605, a plurality of local PIs 625, data sampler circuitry 640, phase detector and CDR circuitry 660, and phase calibration circuitry 680.

In various embodiments, the digital PI circuit 605 is coupled to the multi-phase clock generator 602 and the phase detector and CDR circuitry 660. In these embodiments, the global PI circuit 605 generates initial-adjusted phases from the phases of the clock signal based on a control signal received from the CDR circuitry 660. In some embodiments, the global PI circuit 605 includes a first global PI (e.g., PI-00) to generate a first differential pair of the initial-adjusted phases (e.g., Edge00, Edge180) of the clock signal and a second global PI (e.g., PI-90) to generate a second differential pair of the initial-adjusted phases (e.g., Edge90, Edge270) of the clock signal. In these embodiments, each of the first global PI and the second global PI is configured with 360 degrees of phase shift capability. In some embodiments, the Edge270 phase of the initial-adjusted phases is not sent, but the differential opposite in Edge 90 is provided to the plurality of local PIs 625, which is sufficient.

In some embodiments, each of the plurality of local PIs 625 is coupled to the global PI circuit 605 and is configured to receive the initial-adjusted phases of the clock signal (from the global PI circuit 605) and to apply a particular fixed phase shift to the initial-adjusted phases to generate final-adjusted phases of the clock signal that are specific (e.g., customized) to the PAM level sampler to which these particular final-adjusted phases are provided. Thus, for example, a first local PI coupled may receive the initial-adjusted phases of the clock signal and apply a first fixed phase shift to the initial-adjusted phases to generate first final-adjusted phases of the clock signal that are useable to sample a first level of multiple levels of a pulse-amplitude-modulated (PAM) data stream. Further, in this example, a second local phase interpolator may receive the initial-adjusted phases of the clock signal and apply a second fixed phase shift to the initial-adjusted phases to generate second final-adjusted phases of the clock signal that are useable to sample a second level of the multiple levels of the PAM data stream, wherein the second fixed phase shift is different than the first fixed phase shift.

In some embodiments, the particular fixed phase shift is configurable to be between zero and 90 degrees. In some embodiments, each of the first global PI and the second global PI employs a fixed set of bits to phase-adjust the phases of the clock signal. In these embodiment, each local PI of the plurality of PIs 625 employs the fixed set of bits to apply the first fixed phase shift to the initial-adjusted phases of the clock signal.

As illustrated by way of example, in some embodiments, each local PI 625 may include a set of PIs, e.g., a first PI 625A and a second PI 625B. In at least one embodiment, the first PI 625A receives initial-adjusted phases Edge00 and Edge90 of the clock signal and generates final-adjusted phases (e.g., Local00 and Local90). In at least one embodiment, the second PI 625B receives initial-adjusted phases Edge90 and Edge180 of the clock signal and generates final-adjusted phases (e.g., Local90 (or Local270), Local180). All four of these phases, which are also differential sets of phases, are provided to a data sampler of the data sampler circuitry 640 corresponding to a particular PAM level. In this way, each local PI of the plurality of local PIs 625 generates final-adjusted phases of the clock signal for a different data sampler that samples one level of multiple PAM levels within the incoming PAM data stream.

In various embodiments, the final-adjusted phases of the clock signal (CLK_signal) are useable to sample a particular level of multiple levels of a pulse-amplitude-modulated (PAM) data stream. These various levels are illustrated as edges, level 0, level 1, ... level $2^{N-1}$. Thus, cascaded PI topology 600 could sample edges in addition to at least one up level (UP), at least one middle level (MD), and at least one down level (DN). Not all possible PAM sampling levels in a general device are illustrated due to lack of space. As mentioned, however, a system, device, or receiver containing the cascaded PI topology 600 could be configured to receive, sample, and extract PAM4, PAM8, PAM16, or the like data stream.

Figure 6B:
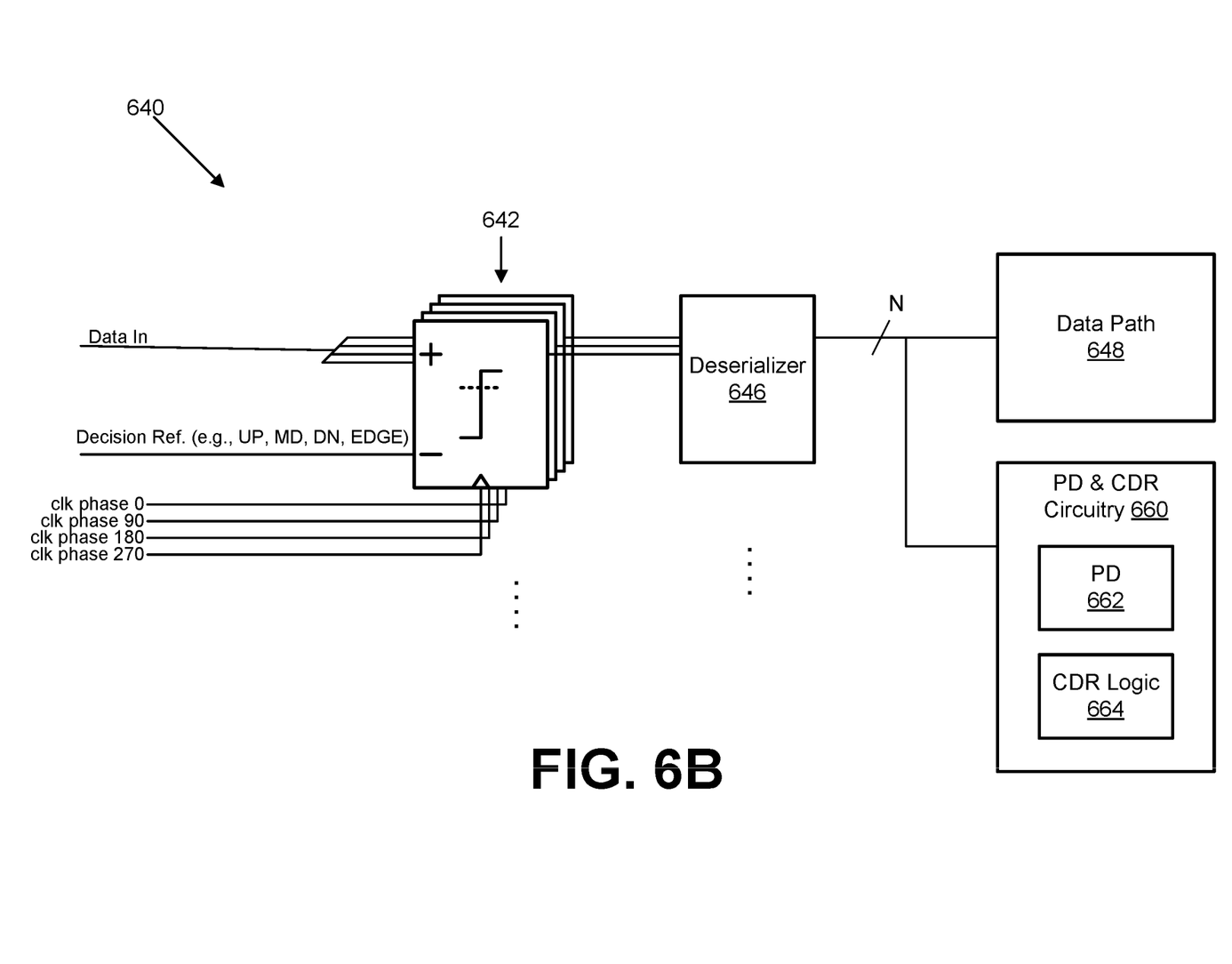
FIG. 6B is a schematic block diagram of an example data sampler circuitry for any given level of the multilevel PAM data sampling according to some embodiments.

FIG. 6B is a schematic block diagram of an example of the data sampler circuitry 640 for any given level of the multilevel PAM data sampling according to some embodiments. In some embodiments, the circuitry is illustrated in FIG. 6B can be replicated (see dots) for each PAM level, but for simplicity, a single instantiation of circuitry is illustrated. In at least some embodiments, the data sampler circuitry 640 includes a data sampler circuit 642 coupled to the local PI (e.g., a particular local PI associated with a particular PAM data level).

In these embodiments, the data sampler circuit 642 samples the particular level of the PAM data stream (e.g., UP, MD, DN, EDGE on "Data In") using the final-adjusted phases of the clock signal generated by the particular local PI, e.g., CLK00, CLK90, CLK180, and CLK270 coming from that particular local PI. A decision reference may be provided to the data sampler circuit 642 in order to provide a voltage level for comparison with the PAM data level being sampled. For example, the data sampler circuit 642 may be configured to determine a polarity of the difference between the input data ("Data In") and the incoming decision reference signal ("Decision Reference") for a particular PAM data level. In at least some embodiments, the data sampler circuitry 640 includes a deserializer coupled to the data sampler circuit 642 to generate an N-bit data stream associated with the particular level of the PAM data stream.

In various embodiments, the received data signal ("Data In") is sampled at a quadrature rate using the multiple phases that were generated by the cascaded PI topology 200 or 600. This is an example for a PAM4 data signal, with sampling of the data edges for Bang-Bang type phase detection. Other sampling schemes may be used for different needs (e.g., PAM-8 signal or different types of phase detectors, as was discussed).

With additional reference to FIG. 6A, in at least some embodiments, the phase detector and CDR circuitry 660 includes a phase detector 662 coupled to the deserializer 646. In these embodiments, the phase detector 662 is configured to detect a polarity of a phase difference between data sampled by the data sampler circuit 642 and the final-adjusted phases of the clock signal, e.g., Local00, Local90, Local180, Local270. In some embodiments, the phase detector and CDR circuitry 660 further includes CDR logic 664, which is coupled between the phase detector 662 and the global PI circuit 605. In these embodiments, the CDR logic 6644 is configured to accumulate phase differences for a series of sampling points of the PAM data stream and generate a digital word as the control signal based on the accumulation of the phase differences.

With additional reference to FIG. 6A, in various embodiments, the phase calibration circuitry 680 is employed to ensure that the global PIs of the global PI circuit 605 remain orthogonal to each other, e.g., have a mutual phase difference of 90 degrees. In some embodiments, the phase calibration circuitry 680 is the same or similar to the phase calibration circuitry 280 (FIG. 2). In some embodiments, the phase calibration circuitry 680 is configured to determine a correct offset (e.g., digital input difference between the digital inputs of the PI-90 and PI-00), which will cancel any impairments that cause the output of the PI-00 and the output of the PI-90 to differ from 90 degrees of phase difference (orthogonal phases). In some embodiments, the deviations from orthogonal phases are present in the received input clocks (e.g., CLK00, CLK90, CLK180, CLK270) and/or are due to mismatches in the manufacturing process of the PI-00 and PI-90 phase interpolators.

In various embodiments, during a calibration phase, the phase detector and CDR circuitry 660 is disconnected from inputs to the global PI circuit 605, e.g., via switch 682. During calibration, for example, the global PI-00 receives a digital input word via switch 684 that corresponds to the middle of the phases range ($2^{K-1}$ for a K bits PI) and the PI-90 receives the same digital input plus a phase-calibration offset. In some embodiments, the phase-calibration offset is added via a digital adder 686 of the cascaded PI topology 600.

In varied embodiments, the phase calibration circuitry 680 performs the calibration by sampling the output of the global PI-00 with the output of the global PI-90. In embodiments, the phase calibration circuitry 680 sweeps for the digital offset by sweeping the edges of the PI-00 output (0 degrees and 180 degrees difference between the output clocks). In some embodiments, the phase calibration circuitry 680 includes a ones-ratio machine, which outputs 100% when the phase-difference is between 0 to 180 degrees and 0% when phase difference is less than 0 degrees or more than 180 degrees. In this way, when the ones-ratio machine crosses the 50%, this will be the place where the offset exhibits 0 and 180 degrees in phase difference. In these embodiments, the phase calibration circuitry 680 calculates an average value of the digital codes corresponding to 0 and 180 degrees and stores this average as the digital calibration offset, which should be added to the PI-90 digital input during functional operation.

In some embodiments, after calibration is done, the output of the CDR circuitry 660 (or CDR logic 664) is connected to the global PIs of the global PI circuit 205. For example, the global PI-00 receives the CDR digital output directly, while the global PI-90 gets the CDR digital output plus the digital offset, enabling normal operation with calibrated phase adjustment of the digital phase offset.

Figure 7:
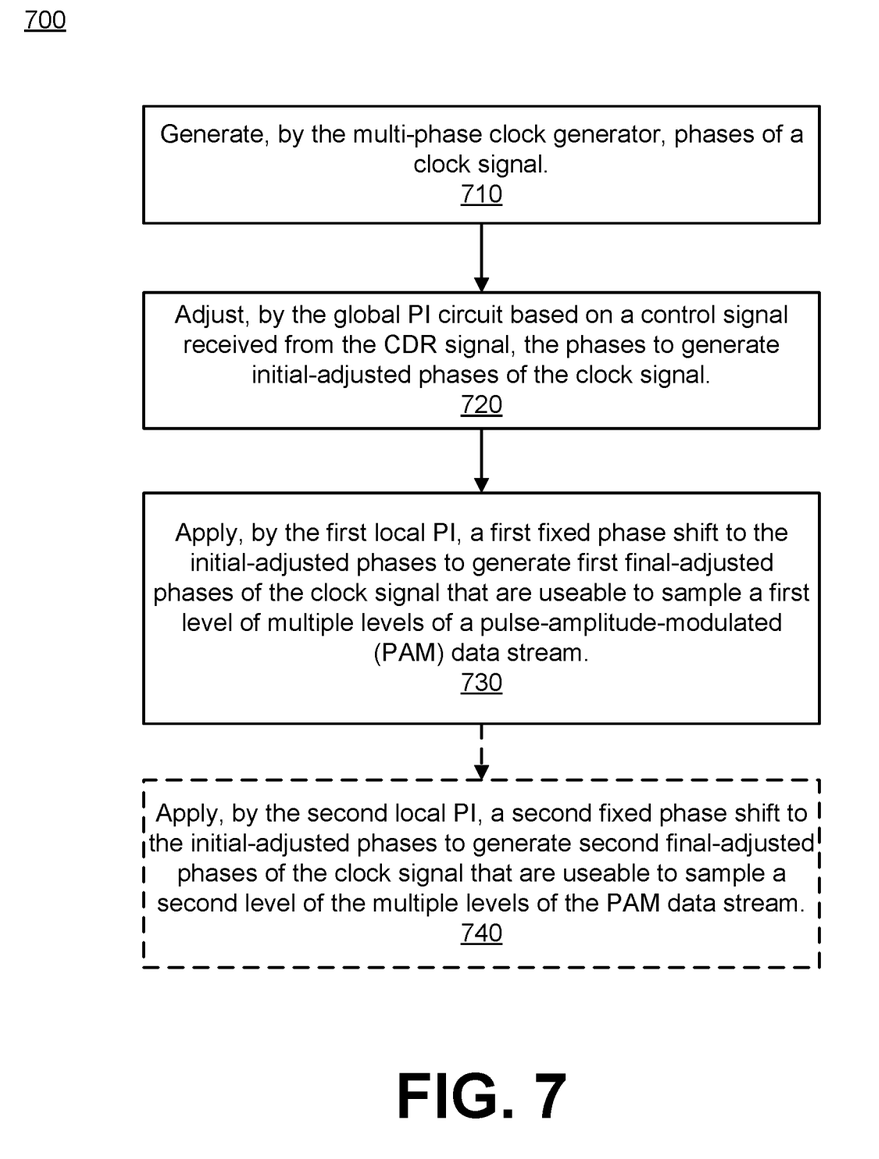
FIG. 7 is a flow chart of an example method for operating a receiver incorporating cascaded PI topology for quadrature-rate multilevel PAM data sampling according to some embodiments.

FIG. 7 is a flow chart of an example method 700 for operating a receiver incorporating cascaded PI topology for quadrature-rate multilevel PAM data sampling according to some embodiments. The method 700 can be performed by processing logic comprising hardware, software, firmware, or any combination thereof. For example, the method 700 can be performed by a receiver, device, or system containing the cascaded PI topology 200 or 600, as discussed in detail herein. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic generates, by the multi-phase clock generator, phases of a clock signal.

At operation 720, the processing logic adjusts, by the global PI circuit based on a control signal received from the CDR signal, the phases to generate initial-adjusted phases of the clock signal.

At operation 730, the processing logic applies, by the first local PI, a first fixed phase shift to the initial-adjusted phases to generate first final-adjusted phases of the clock signal that are useable to sample a first level of multiple levels of a pulse-amplitude-modulated (PAM) data stream.

At operation 740, the processing logic optionally applies, by the second local PI, a second fixed phase shift to the initial-adjusted phases to generate second final-adjusted phases of the clock signal that are useable to sample a second level of the multiple levels of the PAM data stream.

Other variations are within the scope of the present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein, and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to actions and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a sub-system, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or an inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A receiver comprising:
   a multi-phase clock generator to generate phases of a clock signal;
   a global phase interpolator (PI) circuit coupled to the multi-phase clock generator and to clock and data recovery (CDR) circuitry, the global PI circuit to generate initial-adjusted phases from the phases of the clock signal based on a control signal received from the CDR circuitry; and
   a first local PI coupled to the global PI circuit, the first local PI to:
      receive the initial-adjusted phases of the clock signal; and
      apply a first fixed phase shift to the initial-adjusted phases to generate first final-adjusted phases of the clock signal that are useable to sample a first level of multiple levels of a pulse-amplitude-modulated (PAM) data stream.

2. The receiver of claim 1, wherein the global PI circuit comprises:
   a first global PI to generate a first differential pair of the initial-adjusted phases of the clock signal; and
   a second global PI to generate a second differential pair of the initial-adjusted phases of the clock signal, wherein each of the first global PI and the second global PI is configured with 360 degrees of phase shift capability.

3. The receiver of claim 2, wherein each of the first global PI and the second global PI employs a fixed set of bits to phase-adjust the phases of the clock signal, and wherein the first local PI employs the fixed set of bits to apply the first fixed phase shift to the initial-adjusted phases of the clock signal.

4. The receiver of claim 1, wherein the first fixed phase shift is configurable to be between zero and 90 degrees and no more than a largest possible difference between phase levels expected in the PAM data stream.

5. The receiver of claim 1, further comprising a second local phase interpolator coupled to the global phase interpolator, the second local phase interpolator to:
   receive the initial-adjusted phases of the clock signal; and
   apply a second fixed phase shift to the initial-adjusted phases to generate second final-adjusted phases of the clock signal that are useable to sample a second level of the multiple levels of the PAM data stream, wherein the second fixed phase shift is different than the first fixed phase shift.

6. The receiver of claim 5, wherein the first level comprises an up level and the second level comprises one of a middle level, a down level, or edges of the PAM data stream.

7. The receiver of claim 1, further comprising:
   a first data sampler circuit coupled to the first local PI, the first data sampler circuit to sample the first level of the PAM data stream using the first final-adjusted phases of the clock signal; and
   a first deserializer coupled to the first data sampler circuit to generate a bit data stream associated with the first level of the PAM data stream.

8. The receiver of claim 7, further comprising:
   a phase detector coupled to the deserializer and to detect a polarity of a phase difference between data sampled by the first data sampler circuit and the final-adjusted phases of the clock signal; and
   the CDR circuitry comprising CDR logic coupled between the phase detector and the global PI circuit, the CDR logic to:
      accumulate phase differences for a series of sampling points of the PAM data stream; and
      generate a digital word as the control signal based on the accumulation of the phase differences.

9. A system comprising:
   a multi-phase clock generator to generate phases of a clock signal;
   a global phase interpolator (PI) circuit coupled to the multi-phase clock generator and to clock and data recovery (CDR) circuitry, the global PI circuit to generate initial-adjusted phases from the phases of the clock signal based on a control signal received from the CDR circuitry;
   a first local PI coupled to the global PI circuit, the first local PI to:
      receive the initial-adjusted phases of the clock signal; and
      apply a first fixed phase shift to the initial-adjusted phases to generate first final-adjusted phases of the clock signal; and
   a first data sampler circuit coupled to the first local PI, the first data sampler circuit to sample a first level of multiple levels of a pulse-amplitude-modulated (PAM) data stream using the first final-adjusted phases of the clock signal.

10. The system of claim 9, wherein the global PI circuit comprises:
    a first global PI to generate a first differential pair of the initial-adjusted phases of the clock signal; and
    a second global PI to generate a second differential pair of the initial-adjusted phases of the clock signal, wherein each of the first global PI and the second global PI is configured with 360 degrees of phase shift capability.

11. The system of claim 10, wherein each of the first global PI and the second global PI employs a fixed set of bits to phase-adjust the phases of the clock signal, and wherein the first local PI employs the fixed set of bits to apply the first fixed phase shift to the initial-adjusted phases of the clock signal.

12. The system of claim 9, wherein the first fixed phase shift is configurable to be between zero and 90 degrees and no more than a largest possible difference between phase levels expected in the PAM data stream.

13. The system of claim 9, further comprising a second local phase interpolator coupled to the global phase interpolator, the second local phase interpolator to:
    receive the initial-adjusted phases of the clock signal; and apply a second fixed phase shift to the initial-adjusted phases to generate second final-adjusted phases of the clock signal that are useable to sample a second level of the multiple levels of the PAM data stream, wherein the second fixed phase shift is different than the first fixed phase shift.

14. The system of claim 13, wherein the first level comprises an up level and the second level comprises one of a middle level, a down level, or edges of the PAM data stream.

15. The system of claim 9, further comprising a first deserializer coupled to the first data sampler circuit to generate a bit data stream associated with the first level of the PAM data stream.

16. The system of claim 15, further comprising:
a phase detector coupled to the deserializer and to detect a polarity of a phase difference between data sampled by the first data sampler circuit and the final-adjusted phases of the clock signal; and
the CDR circuitry comprising CDR logic coupled between the phase detector and the global PI circuit, the CDR logic to:
accumulate phase differences for a series of sampling points of the PAM data stream; and
generate a digital word as the control signal based on the accumulation of the phase differences.

17. A method of operating a receiver comprising a multi-phase clock generator, a global phase interpolator (PI) circuit coupled to the multi-phase clock generator and to a clock and data recovery (CDR) circuit, and a first local PI coupled to the global PI circuit, wherein the method of operating the receiver comprises:
generating, by the multi-phase clock generator, phases of a clock signal;
adjusting, by the global PI circuit based on a control signal received from the CDR signal, the phases to generate initial-adjusted phases of the clock signal; and
applying, by the first local PI, a first fixed phase shift to the initial-adjusted phases to generate first final-adjusted phases of the clock signal that are useable to sample a first level of multiple levels of a pulse-amplitude-modulated (PAM) data stream.

18. The method of claim 17, wherein the receiver further comprises a second local PI coupled to the global PI circuit, and wherein the method of operating the receiver further comprises applying, by the second local PI, a second fixed phase shift to the initial-adjusted phases to generate second final-adjusted phases of the clock signal that are useable to sample a second level of the multiple levels of the PAM data stream.

19. The method of claim 18, wherein the first level comprises an up level and the second level comprises one of a middle level, a down level, or edges of the PAM data stream.

20. The method of claim 17, wherein the receiver further comprises a first data sampler circuit coupled to the first PI and a first deserializer coupled to the first data sampler circuit, and wherein the method of operating the receiver further comprises:
sampling, using the first data sampler circuit, the first level of the PAM data stream using the first final-adjusted phases of the clock signal; and
generating, using the first deserializer, a bit data stream associated with the first level of the PAM data stream.

21. The method of claim 20, wherein the receiver further comprises a phase detector coupled to the deserializer, and CDR logic coupled to the phase detector, and wherein the method of operating the receiver further comprises:
detecting, using the phase detector, a polarity of a phase difference between data sampled by the first data sampler circuit and the final-adjusted phases of the clock signal;
accumulating, using the CDR logic, phase differences for a series of sampling points of the PAM data stream; and
generating, using the CDR logic, a digital word as the control signal based on the accumulation of the phase differences.

* * * * *